(12) United States Patent
Avci et al.

(10) Patent No.: US 7,652,910 B2
(45) Date of Patent: Jan. 26, 2010

(54) FLOATING BODY MEMORY ARRAY

(75) Inventors: Uygar E. Avci, Beaverton, OR (US);
Peter L. D. Chang, Portland, OR (US);
Dinesh Somasekhar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 168 days.

(21) Appl. No.: 11/772,191

(22) Filed: Jun. 30, 2007

(65) Prior Publication Data

US 2009/0003050 A1   Jan. 1, 2009

(51) Int. Cl.
*G11C 11/24* (2006.01)
(52) U.S. Cl. .................................... 365/149; 365/181
(58) Field of Classification Search ................. 365/149, 365/181, 190
See application file for complete search history.

(56) References Cited

U.S. PATENT DOCUMENTS

| | | | |
|---|---|---|---|
| 6,421,269 B1 | 7/2002 | Somasekhar |
| 6,421,289 B1 | 7/2002 | Lu |
| 6,496,402 B1 | 12/2002 | Somasekhar |
| 6,567,329 B2 | 5/2003 | Somasekhar |
| 6,721,222 B2 | 4/2004 | Somasekhar |
| 6,724,648 B2 | 4/2004 | Khellah |
| 6,757,784 B2 | 6/2004 | Lu |
| 6,903,984 B1 | 6/2005 | Tang |
| 6,906,973 B1 | 6/2005 | Somasekhar |
| 6,909,652 B2 | 6/2005 | Ye |
| 6,952,376 B2 | 10/2005 | Somasekhar |
| 6,992,339 B2 | 1/2006 | Keshavarzi |
| 7,001,811 B2 | 2/2006 | Keshavarzi |
| 7,002,842 B2 | 2/2006 | Tang |
| 7,031,203 B2 | 4/2006 | Tang |
| 7,049,654 B2 | 5/2006 | Chang |
| 7,057,927 B2 | 6/2006 | Tang |
| 7,061,806 B2 | 6/2006 | Tang |
| 7,072,205 B2 | 7/2006 | Tang |
| 7,075,821 B2 | 7/2006 | Ye |
| 7,085,153 B2 * | 8/2006 | Ferrant et al. ............... 365/149 |
| 7,098,507 B2 | 8/2006 | Tang |
| 7,120,072 B2 | 10/2006 | Ye |
| 7,123,500 B2 | 10/2006 | Ye |
| 7,132,751 B2 | 11/2006 | Chang |
| 7,167,397 B2 | 1/2007 | Paillet |
| 7,177,175 B2 | 2/2007 | Fazan |
| 7,230,842 B2 | 6/2007 | Khellah |
| 7,230,846 B2 | 6/2007 | Keshavarzi |
| 7,236,410 B2 | 6/2007 | Schrom |
| 7,246,215 B2 | 7/2007 | Lu |
| 7,295,474 B2 | 11/2007 | Ye |
| 7,332,779 B2 | 2/2008 | Chang |
| 7,355,246 B2 | 4/2008 | Keshavarzi |
| 7,385,865 B2 | 6/2008 | Khellah |

(Continued)

OTHER PUBLICATIONS

International Search Report and Written Opinion for International Application No. PCT/US2008/068184 dated Feb. 23, 2009; 7 pgs.

*Primary Examiner*—Vu A Le
(74) *Attorney, Agent, or Firm*—Erik R. Nordstrom

(57) ABSTRACT

Provided herein are embodiments of layouts for applying impact ionization potentials across the channel of a selected floating body cell in an array without having to impose the potential on other unselected cells.

21 Claims, 4 Drawing Sheets

U.S. PATENT DOCUMENTS

| | | |
|---|---|---|
| 7,391,640 B2 | 6/2008 | Tang |
| 7,439,588 B2 | 10/2008 | Ban |
| 7,492,632 B2 * | 2/2009 | Carman ................... 365/177 |
| 7,501,316 B2 | 3/2009 | Keshavarzi |
| 7,514,746 B2 | 4/2009 | Tang |
| 2005/0097276 A1 | 5/2005 | Lu |
| 2006/0054977 A1 | 3/2006 | Somasekhar |
| 2006/0067126 A1 | 3/2006 | Tang et al. |
| 2006/0114717 A1 | 6/2006 | Fazan |
| 2006/0208301 A1 * | 9/2006 | Shino ..................... 257/314 |
| 2006/0279985 A1 | 12/2006 | Keshavarzi |
| 2007/0002607 A1 | 1/2007 | Khellah |
| 2007/0278572 A1 | 12/2007 | Ban |
| 2008/0090348 A1 | 4/2008 | Chang |
| 2008/0111190 A1 | 5/2008 | Chang |
| 2008/0149984 A1 | 6/2008 | Chang |
| 2008/0150075 A1 | 6/2008 | Chang |
| 2008/0158932 A1 | 7/2008 | Khellah |
| 2008/0237672 A1 | 10/2008 | Doyle |
| 2009/0001438 A1 | 1/2009 | Doyle |
| 2009/0003108 A1 | 1/2009 | Somasekhar |
| 2009/0017589 A1 | 1/2009 | Ban |

* cited by examiner

FLOATING BODY MEMORY ARRAY

BACKGROUND

The present invention relates generally to memory and in particular to floating body memory structures.

So-called floating body memory, e.g., floating body dynamic random access memory (FB-DRAM) generally comprises an array of floating body memory cells. A floating body cell is typically formed from a MOSFET (metal oxide semiconductor field effect transistor) disposed atop an insulator such as with silicon on insulator (SOI) type processes or bulk processed chips with separately added insulator areas. An FB cell uses the so-called "history" effect where some of the charge conducted through a transistor having a floating body is retained in the body like a capacitor. The amount of retained charged is affected by different parameters such as the quality of the insulator insulating the body, the amount of body field strength bias, and of course, the amount of charge conducted through it, which is a function of the transistor's threshold voltage, along with the applied gate and drain/source voltages.

FIG. 1a shows a portion of a conventional layout for a dynamic random access memory (DRAM) array such as for a floating body cell DRAM. Illustrated are active strips 102 (102A to 102C), bit line conductor strips 104 (104A to 104c), wordline conductor strips 106 (106 to 106F), conductive source lines 108 (108A to 108C), conductive traces 110 and vias 111, to accommodate transistor cells. The active areas 102 comprise the channel conduction terminals (sources, drains), along with the bodies, which have at least a portion between the conduction terminals to form the channels when suitably biased. (A portion of the body between the source and drain forms a channel to conduct charge carriers between the source and drain when the gate is sufficiently biased. If the gate is so biased and a sufficient potential is dropped across the channel, depending on the direction of the potential, then a '1 or a '0 will be written into it. It should be appreciated that as FETs are typically symmetrical devices, either of the channel conduction terminals may be the source or drain, depending on how they are biased.)

For each transistor, a first channel conduction terminal (e.g., drain) is coupled to a bit line 104 by way of a via 111 and conductor 110; a second channel conduction terminal (e.g., source) is coupled to a source line 108; and the gate is coupled to a wordline conductor strip 106. In this layout, vertically adjacent transistors share common source lines, and vertically aligned cells share a common bit line 104. Also in this depiction, the source lines are coupled to a fixed supply reference (e.g., ground), while the bit lines and wordlines are addressable.

With reference to FIG. 1B, in this depiction, the FB cells use a relatively high bit line (BL) bias to assert (e.g., write a data '1 into) or erase (write a data '0 into) a cell using impact ionization. (Note that the terms: erase and assert are arbitrarily assigned '0 and '1, respectively, and could be reversed.) In particular, if a selected cell is erased, then a −2.0 V potential is dropped across the bit and source lines. Conversely, if a cell is to be asserted, then a 2.0 V potential is dropped across the bit and source lines.

FIG. 1B shows applied voltage levels for the channel conduction and gate terminals, along with the body, of four neighboring transistors (T1 to T4) from FIG. 1A. (Note that the body is not directly coupled to a bias voltage but rather is exposed to a corresponding field from the insulator, e.g., below it, which is biased and acts like a capacitor.) During programming, selected cells to be programmed (word line selected, T2 and T4 in this figure) are programmed by the bit line, which causes either a positive or negative 2.0 V potential to be dropped across the bit and source lines, depending, respectively, on whether a '1 or '0 is to be programmed into the cell.

Unfortunately, with this configuration, cells such as T1 and T3 that are vertically aligned with and neighbor a selected cell also have their channels exposed to write potentials of −2.0 or 2.0 V. Due to the effects of gate induced drain leakage (GIDL), this can cause their data to be flipped or otherwise lost, even though their gates are not selected.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In accordance with some embodiments, provided herein are layouts (e.g., layouts for DRAM cell arrays) that allow for programming a selected cell using a sufficient channel potential drop (e.g., in excess of 1.5 V with typical transistor parameters used today). At the same time, neighboring transistor cells are not subjected to excessively detrimental channel potential drops, e.g., that are large enough to cause data to be corrupted or require unreasonably increased refresh rates.

Figure 1A:
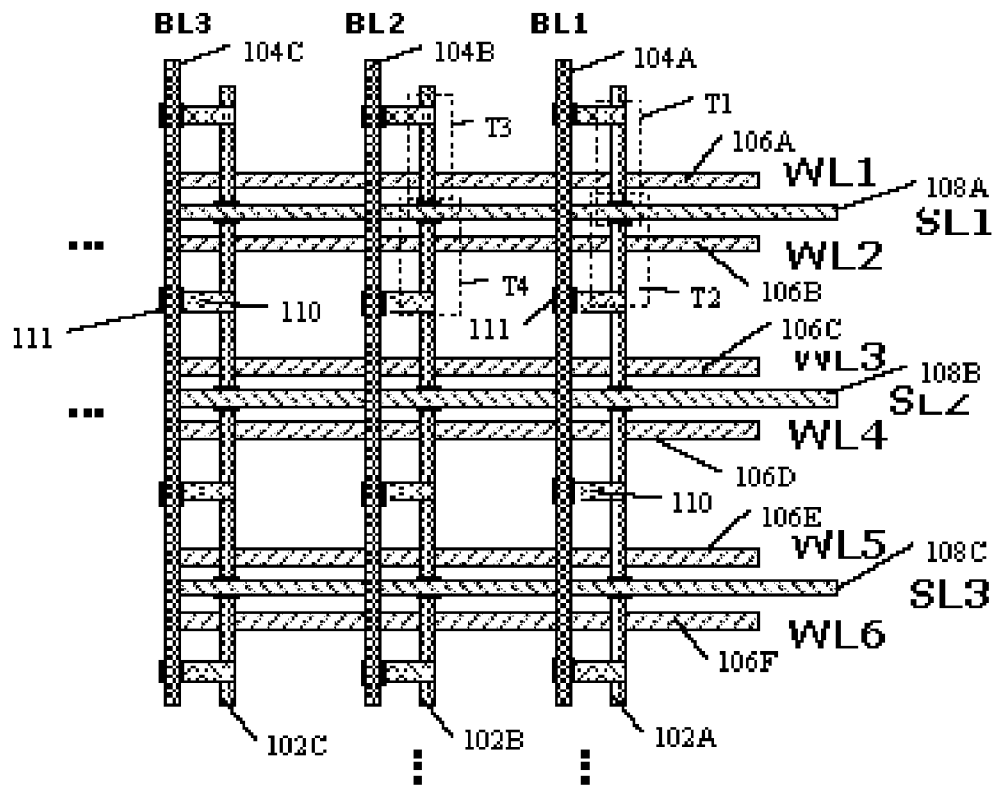
FIG. 1A is a diagram of a portion of a conventional floating body memory array.
Figure 2A:
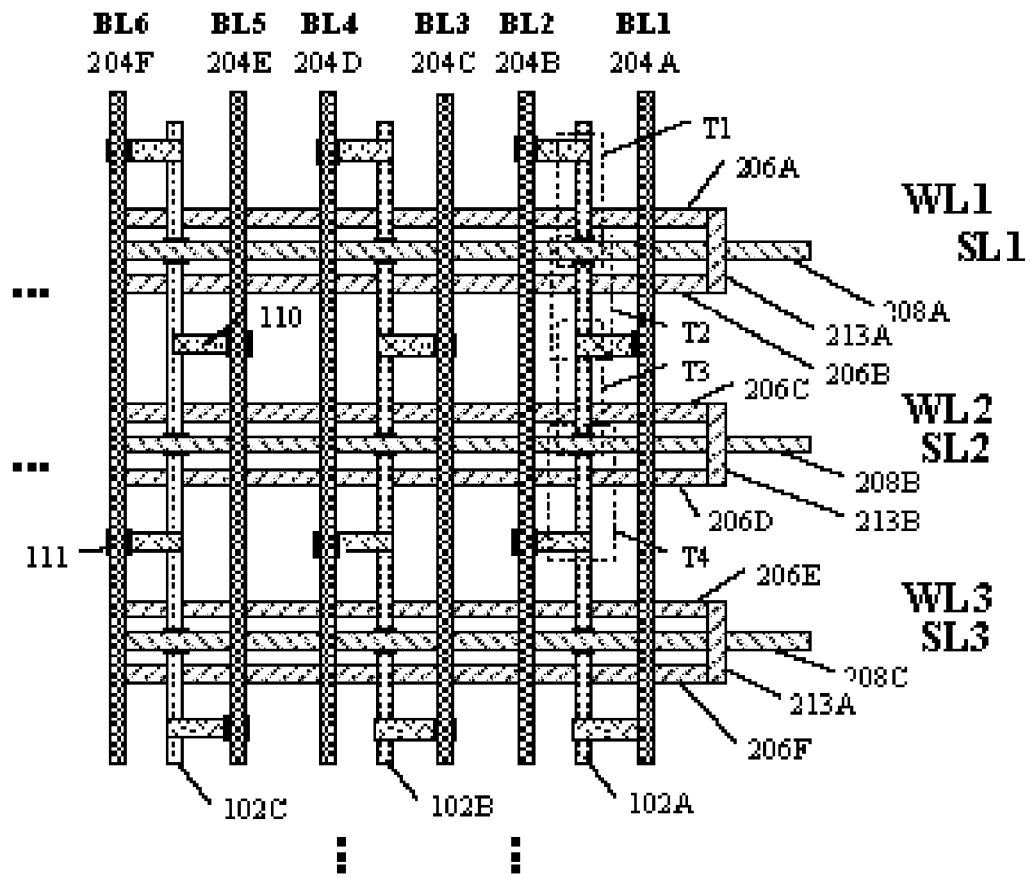
FIG. 2A is a portion of a floating body memory array in accordance with some embodiments.

FIG. 2A shows a portion of a layout for an FB cell array in accordance with some embodiments. This layout is similar to that of FIG. 1A, except for several differences. First, it employs an additional bit line conductor 204 for each active strip 102, which allows for transistors having a common source line and neighboring wordlines (e.g., transistors T1, T2 with common source line 208A and neighboring wordlines 206A, 206B) to have different bit lines 204 (e.g., 204A, 204B for transistors T1 and T2). This allows for neighboring transistors with a common source line to be biased at different channel potential drops.

Figure 3:
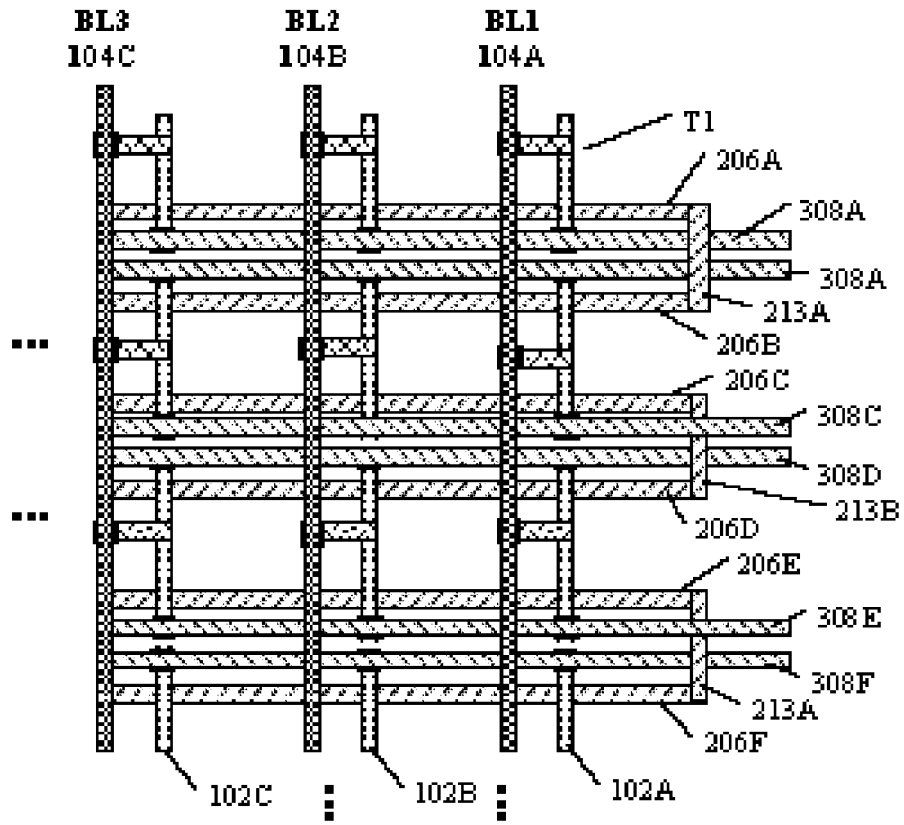
FIG. 3 is a portion of a floating body memory array in accordance with some other embodiments.

(Note that in other embodiments, for example, the same result could be achieved by using separate source lines with a common bit line for neighboring transistor pairs, as is illustrated in FIG. 3. That is, to obtain appropriate impact ionization, additional source and/or bit lines can be used to write to one or more selected cells using a sufficient channel voltage drop without having to apply the same drop on unselected cells. Moreover, the voltage direction is typically not limiting. A sufficient channel potential drop is required for impact ionization, but it generally doesn't matter which channel terminal is higher. Of course this can be affected based on, for example, whether the FET is a P or an N channel FET, as well as on the FET's threshold voltage.)

With the depicted embodiment, wordline pairs (e.g., 206A, 206B) sharing a common source line may be coupled together using a conductor 213. For example, in the depicted embodiment, wordline conductors 206A, 206B are coupled together with a conductor 213A. this may be more efficient for implementing, for example, a write erase operation, e.g., where '0s are written to each cell in the array (discussed below with respect to FIG. 2B). Also, with this embodiment, the source lines are not coupled to a fixed reference but rather are separately addressable. In this way, sufficient impact ionization voltages can be attained for a selected cell without having to impose the same channel potential drop on other cells on the same bit line.

In accordance with some embodiments, data is programmed pursuant to a 2-cycle write process. During the first cycle, all of the cells in a word line are erased (i.e., programmed with a '0). Next, during the second cycle, cells that are to store a '1 are asserted, i.e., programmed with a '1. This may serve to provide for more stable data writing and storage. The coupled together neighboring word lines of FIG. 2A can provide for more efficient erase operations, pursuant to this process, allowing for twice as many rows to be erased per erase cycle.

Figure 1B:
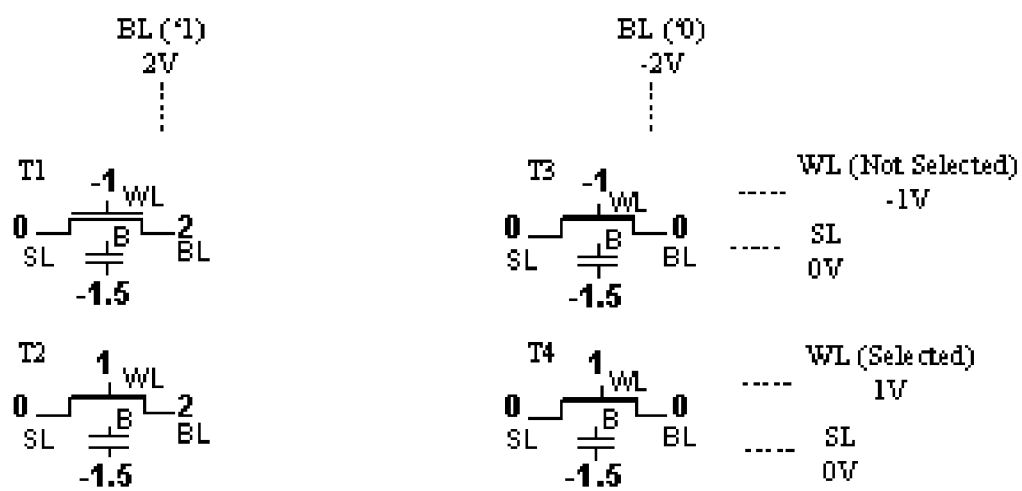
FIG. 1B shows voltage levels for neighboring transistors during a programming phase for the memory array of FIG. 1A.
Figure 2B:
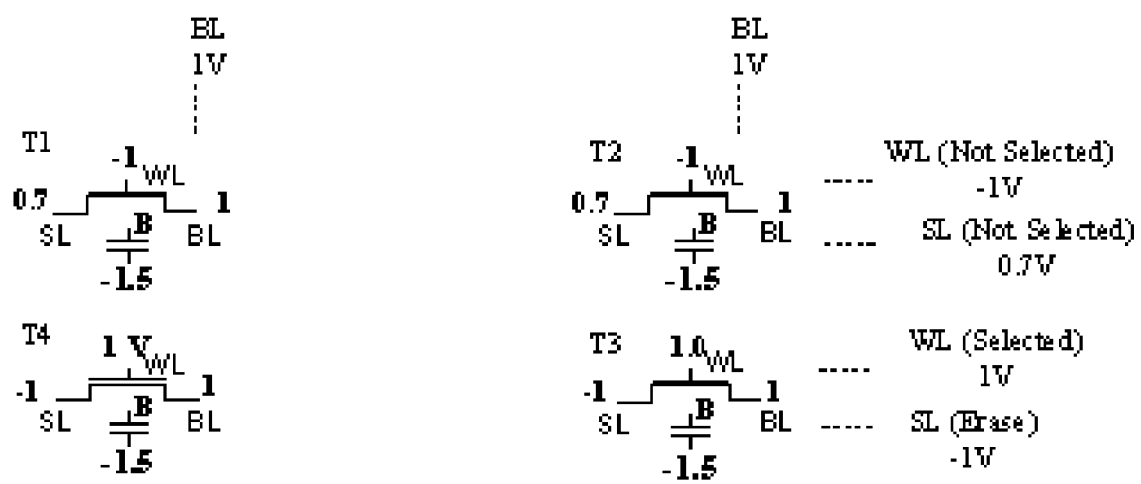
FIG. 2B shows voltage levels for neighboring transistors during an erase phase for the memory array of FIG. 2A.

FIG. 2B shows voltage levels for a low-disturb program erase operation. With their word lines selected, T3 and T4 are to be erased. A 1V potential is applied to all of the bit lines, while a 1V potential is applied to selected word lines and a −1.0 V potential is applied to selected source lines. For the unselected cells (T1, T2), −1 V is applied to the word lines and 0.7 V is applied to the source lines. In this way, a −2.0 potential is dropped between source and bit lines for selected cells to erase them, but only a −0.3 V potential is dropped between the source and drain lines of unselected cells, which is reasonable for low disturbance. With this approach, a cell to be erased still receives a high channel potential drop (−2 V as with the example of FIG. 1A) to implement impact ionization. However, the other drops ARE spread out so that the worst case disturbance conditions can be reduced. (Note that with this example, the negative erase potential is dropped from the source to bit lines and not from the bit to source lines, as was the case in FIG. 1B.)

Figure 2C:
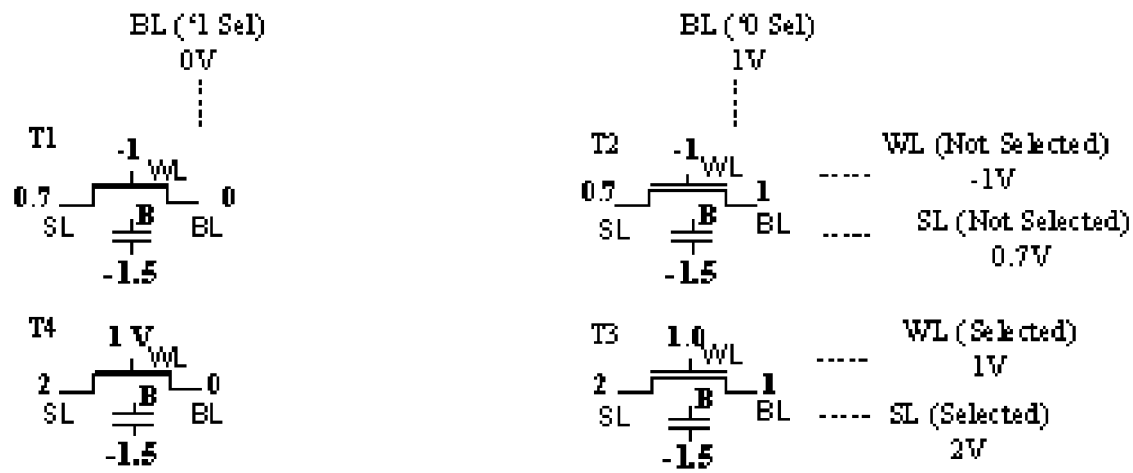
FIG. 2C shows voltage levels for neighboring transistors during a programming phase for the memory array of FIGS. 2A and 2B.

FIG. 2C shows voltage levels for a write-assert (write '1) cycle of a 2-cycle erase-assert program operation. In this example, T4 and T3 are selected for writing, with their word lines at 1 V and source lines at 2 V. With their word lines at −1 V and source lines at 0.7 V, T1 and T2 are not selected. In this example, assume that a '1 was to be programmed into T4 and a '0 was to be programmed into T3. Accordingly, the bit line for T1, T4 is at 0V, while the bit line for T2 and T3 is at 1V. This results in a positive 2V drop applied from the source to bit line of T4, causing a '1 to be written into it. On the other hand, with only 1V applied from the source to bit line of T3, it is unchanged, i.e., the 1V SL-BL drop is not enough to overwrite the '0 from the −2V drop that was imposed during the erase cycle.

Figure 4:
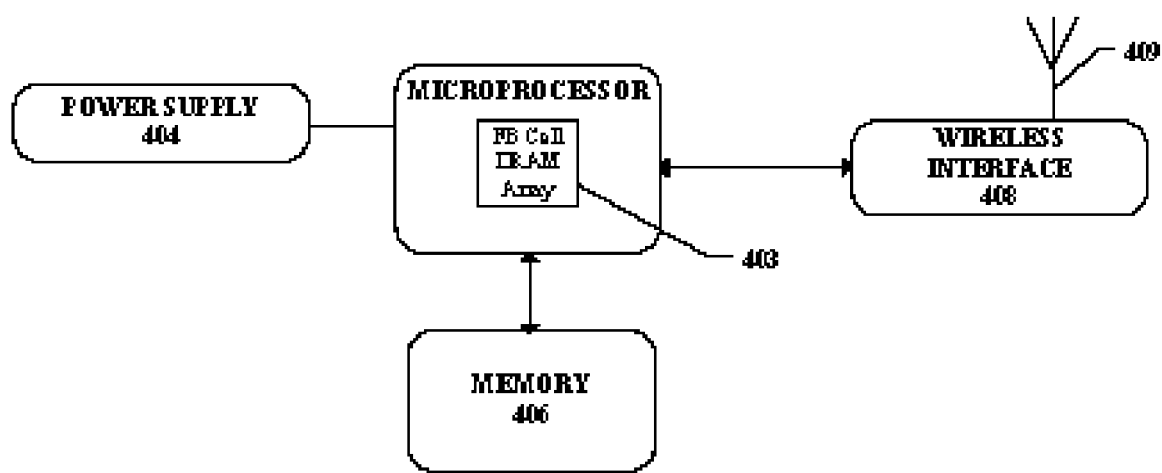
FIG. 4 is a block diagram of a computer system with floating body memory in accordance with some embodiments.

With reference to FIG. 4, one example of a computer system is shown. The depicted system generally comprises a processor 402 that is coupled to a power supply 404, a wireless interface 408, and memory 406. It is coupled to the power supply 404 to receive from it power when in operation. The wireless interface 408 is coupled to an antenna 409 to communicatively link the processor through the wireless interface chip 408 to a wireless network (not shown). The microprocessor 402 comprises one or more embedded FB cell arrays to implement, for example, cache memory in the processor.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, embodiments of the invention cover multi-gated cells, as well as single-gated cells. As an example, with dual-gated cells, e.g., with front and rear gates to control charge storage parameters of a body, the layouts of FIGS. 2 and 3 could be used with the front gate coupled to a wordline. As another example, while impact ionization was used to illustrate a programming technique, other programming techniques such as GIDL programming could also be implemented and are within the scope of the invention. In addition, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
an array of floating body cells each consisting of a single transistor having a channel and a gate to control conduction in the channel, the array comprising conductive signal lines to controllably apply an impact ionization potential across a selected cell's channel without applying said impact ionization potential to unselected cells.

2. The chip of claim 1, in which the conductive signal lines comprise bit lines coupled to sources of the cells and source lines coupled to drains in the cells, the bit and source lines being separately selectably coupleable to two or more different voltage levels.

3. The chip of claim 2, in which adjacent pairs of cells share a common source line but have different bit lines.

4. The chip of claim 3, in which the adjacent pairs of cells share a common wordline coupled to their gates.

5. The chip of claim 2, in which adjacent pairs of cells share a common bit line but have different source lines.

6. The chip of claim 5, in which the adjacent pairs of cells share a common wordline coupled to their gates.

7. The chip of claim 1, in which the impact ionization potential is in excess of 1.5 V.

8. The chip of claim 1, in which each cell has two or more gates.

9. The chip of claim 1, in which the cells are arranged into rows and columns with cells in a common column sharing a common source and wordline but adjacent cells in said common column having different bit lines.

10. A memory, comprising:
- a plurality of floating body cells arranged in rows and columns and each consisting of a single transistor having a gate and a channel;
- a set of first conductors coupled to channels of cells in pairs of adjacent rows; and
- a set of second conductors each coupled to channels of alternating cells in a common column, wherein a potential, sufficient to write a value, can be applied across a selected channel without imposing said potential to unselected channels.

11. The memory of claim 10, in which the set of first conductors are coupled to cell sources, and the set of second conductors are coupled to cell drains.

12. The memory of claim 10, in which the set of first conductors are coupled to cell drains, and the set of second conductors are coupled to cell sources.

13. The memory of claim 10, in which each cell has two or more gates.

14. The memory of claim 10, comprising a set of third conductors each coupled to gates of cells in a common row.

15. The memory of claim 10, in which the potential sufficient for writing a value is in excess of 1.5 V.

16. A system, comprising:
(a) a microprocessor comprising a an array of floating body cells each consisting of a single transistor having a channel and a gate to control conduction in the channel, the array comprising conductive signal lines to controllably apply an impact ionization potential across a selected cell's channel without applying said impact ionization potential to unselected cells; (b) an antenna; and (c) a wireless interface coupled to the microprocessor and to the antenna to communicatively link the microprocessor to a wireless network.

17. The system of claim 16, in which the conductive signal lines comprise bit lines coupled to drains of the cells and source lines coupled to sources in the cells, the bit and source lines being separately selectably coupleable to two or more different voltage levels.

18. The system of claim 17, in which adjacent pairs of cells share a common source line but have different bit lines.

19. The system of claim 18, in which the adjacent pairs of cells share a common wordline coupled to their gates.

20. The system of claim 17, in which adjacent pairs of cells share a common bit line but have different source lines.

21. A method, comprising:
- writing data into a line of floating body cells, the act of writing comprising first writing a '0 into all cells in the line and then writing a '1 into selected cells within the line, wherein a negative impact ionization voltage is applied from source to bit lines of the line of cells when the '0 is written into the cells, and a positive impact ionization voltage is applied from the source to bit lines of the line of cells when a '1 is written into the selected cells.

* * * * *